US011322201B2

(12) United States Patent
Perroni et al.

(10) Patent No.: US 11,322,201 B2
(45) Date of Patent: May 3, 2022

(54) BIT-LINE VOLTAGE GENERATION CIRCUIT FOR A NON-VOLATILE MEMORY DEVICE AND CORRESPONDING METHOD

(71) Applicant: STMicroelectronics S.r.l., Agrate Brianza (IT)

(72) Inventors: Maurizio Francesco Perroni, Messina (IT); Fabio Enrico Carlo Disegni, Spino d'adda (IT); Michele La Placa, Cefalu' (IT); Cesare Torti, Pavia (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 17/159,381

(22) Filed: Jan. 27, 2021

(65) Prior Publication Data

US 2021/0233582 A1 Jul. 29, 2021

(30) Foreign Application Priority Data

Jan. 28, 2020 (IT) .................. 102020000001630

(51) Int. Cl.
*G11C 13/00* (2006.01)

(52) U.S. Cl.
CPC ...... *G11C 13/0026* (2013.01); *G11C 13/0004* (2013.01); *G11C 13/004* (2013.01); *G11C 13/0028* (2013.01); *G11C 13/0038* (2013.01); G11C 2013/0045 (2013.01); G11C 2213/79 (2013.01)

(58) Field of Classification Search
CPC ............ G11C 13/0026; G11C 13/0004; G11C 13/0028; G11C 13/0038; G11C 13/004; G11C 2013/0045; G11C 2213/79; G11C 5/147; G11C 7/14; G11C 2013/0042; G11C 2013/0054

See application file for complete search history.

(56) References Cited

U.S. PATENT DOCUMENTS

| | | | |
|---|---|---|---|
| 8,264,872 B2 * | 9/2012 | De Sandre | G11C 13/0026 365/163 |
| 8,441,382 B2 * | 5/2013 | Mahajan | H03K 17/063 341/136 |
| 9,281,061 B2 | 3/2016 | Di Vincenzo et al. | |
| 2005/0195657 A1 * | 9/2005 | Chen | G11C 5/147 365/185.21 |

(Continued)

*Primary Examiner* — Khamdan N. Alrobaie
(74) *Attorney, Agent, or Firm* — Slater Matsil, LLP

(57) ABSTRACT

An embodiment voltage generation circuit, for a memory having a memory array with a plurality of memory cells coupled to respective wordlines and local bit-lines, each having a storage element and selector element, a bipolar transistor being coupled to the storage element for selective flow of a cell current during reading or verifying operations, and a base terminal of the selector element being coupled to a respective wordline; associated to each bit-line is a biasing transistor having a control terminal, and the circuit generates a cascode voltage for this control terminal; a driver stage is coupled to one end of each wordline. The circuit generates the cascode voltage based on a reference voltage, which is a function of the emulation of a voltage drop on the driver stage, on the wordline, and on the memory cell as a result of a current associated to the corresponding selector element.

20 Claims, 4 Drawing Sheets

(56) References Cited

U.S. PATENT DOCUMENTS

| | | | |
|---|---|---|---|
| 2006/0077710 A1* | 4/2006 | Martines | G11C 16/28 |
| | | | 365/185.2 |
| 2008/0298122 A1 | 12/2008 | Bedeschi et al. | |
| 2009/0175109 A1* | 7/2009 | Lin | G11C 7/08 |
| | | | 365/210.1 |
| 2015/0092470 A1 | 4/2015 | Vimercati et al. | |
| 2018/0143659 A1* | 5/2018 | Wulff | G05F 3/242 |

* cited by examiner

BIT-LINE VOLTAGE GENERATION CIRCUIT FOR A NON-VOLATILE MEMORY DEVICE AND CORRESPONDING METHOD

CROSS-REFERENCE TO RELATED APPLICATIONS

This application claims the benefit of Italian U.S. Provisional Application No. 102020000001630, filed on Jan. 28, 2020, which application is hereby incorporated herein by reference.

TECHNICAL FIELD

The present solution relates to a bit-line voltage generation circuit for a non-volatile memory device, in particular of the phase-change type, and to a corresponding method.

BACKGROUND

As is known, non-volatile memories of the phase-change type (PCMs, Phase-Change Memories, or ePCMs, embedded Phase-Change Memories) envisage storage of information in memory cells, organized in a memory array arranged in rows formed by wordlines (WL) and columns formed by bit-lines (BL), by exploiting phase-change materials, having the property of switching between phases with resistivity of a considerably different value. In particular, these materials are able to switch between an amorphous phase, with high resistivity, and a crystalline or polycrystalline phase, with low resistivity. Consequently, in a phase-change memory cell, it is possible to associate a different value of a datum stored to a respective phase, whether amorphous or crystalline, and a corresponding resistivity, of a corresponding phase-change memory element.

For instance, it is possible to use, as phase-change memory elements, elements of Group VI of the Periodic Table, such as tellurium (Te), selenium (Se), or antimony (Sb), which are referred to as chalcogenides or chalcogenic materials; an alloy made up of germanium (Ge), antimony (Sb), and tellurium (Te), known as GST (having the chemical composition $Ge_2Sb_2Te_5$) currently finds widespread use in such memory elements.

SUMMARY

Phase switching in a memory element can be obtained by locally increasing the temperature of the region of phase-change material, for example by an electric programming current flowing through resistive electrodes (generally known as heaters) set in contact with the region of phase-change material. This electric current, by the Joule effect, generates the temperature variation required for phase change.

In particular, when the phase-change material is in the amorphous state, with high resistivity (the so-called RESET state), application of a first current pulse (the so-called SET pulse) is required having a duration and amplitude such as to enable the material to cool off slowly. Subjected to this treatment, the phase-change material changes its state and switches from the high-resistivity state to a low-resistivity crystalline state (the so-called SET state). Instead, when the phase-change material is in the SET state, application of a second current pulse (RESET pulse) of large amplitude and short duration is required for causing the material to return to the high-resistivity amorphous state.

Reading (or verifying) of the datum stored in a memory cell can be performed applying to the memory element of the phase-change material a biasing voltage that is sufficiently low as not to cause considerable heating thereof and then reading the value of the current that flows in the memory cell. Given that the current is proportional to the conductivity of the phase-change material, it is possible to determine the phase in which the material is and thus the datum stored in the memory cell.

In particular, a reading architecture of a differential type is known, in which two memory cells that store opposite states are associated to each bit of a word to be read (which is made up, in a known way, of an appropriate number of bits). For instance, a bit has the value "1" if a first memory cell (the so-called direct memory cell) and a second memory cell (the so-called complementary or reference memory cell) that are associated to the bit are in the SET state and, respectively, in the RESET state; and has the value "0" if the first and second memory cells are in the RESET state and, respectively, in the SET state. Reading architectures of a differential type afford advantages in terms of reliability, in so far as the datum is stored in a redundant way, and moreover do not require generation of a reference current in so far as reading is carried out simply by comparing the respective currents that flow in the cells associated to a same bit.

In this regard, FIG. 1 shows a portion of a memory array 1 (of a PCM type), and in particular a corresponding (direct) memory cell 2 and the corresponding reference cell 2' (illustrated schematically).

The memory cell 2 comprises a phase-change element 2a, constituted by a phase-change material, for example GST, and a selector element 2b, for example a MOSFET or (as illustrated in FIG. 1) a bipolar junction transistor (BJT), electrically connected to the heater associated to the phase-change element 2a (here not illustrated) so as to enable selective flow of an electric current, designated by $I_{cell}$ (referred to hereinafter as "cell current").

Each memory cell 2, 2' is coupled to a respective bit-line BL, BL' (the so-called local bit-line) that is selected for the storage operations, for example the reading (or verifying) operation, by means of a respective column-decoding unit 5.

In particular, the column-decoding unit 5 comprises a certain number of selection transistors 6, for example PMOS transistors, which are connected in series (or cascaded) between the respective local bit-line BL, BL' and a respective sensing main bit-line MBLs, MBLs' and receive, on a corresponding control terminal, a respective selection signal. Represented by way of example in FIG. 1 are two selection transistors 6a, 6b, which receive a first selection signal $Y_o$ and a second selection signal $Y_n$: the first selection transistor 6a is connected between the local bit-line BL, BL' and a respective main bit-line MBL, MBL'; and the second selection transistor 6b is connected between the main bit-line MBL, MBL' and the respective sensing main bit-line MBLs, MBLs'.

The sensing main bit-lines MBLs, MBLs' associated to the memory cells 2, 2' are moreover coupled to a sense amplifier (SA) stage 9, represented schematically, configured to compare the corresponding cell currents $I_{cell}$, $I_{cell'}$ at the end of reading (or verifying) of the datum stored.

In the sense amplifier stage 9, a biasing transistor 7, in particular a NMOS transistor, is connected between the aforesaid sensing main bit-line MBLs, MBLs' and an input block 9a. The input blocks 9a associated to the sensing main bit-lines MBLs, MBLs' are in turn coupled to a differentialamplification block 9b, configured to implement the aforesaid comparison for reading of the datum stored.

In particular, the biasing transistor 7 receives, on a relative control terminal, an appropriate biasing voltage, so-called cascode voltage $V_{casc}$, such as to impose a maximum allowed value for the voltages on the respective bit-lines (sensing main bit-lines MBLs, MBLs', main bit-lines MBL, MBL', and local bit-lines BL, BL'), thus preventing any possible stress and damage during reading of the datum stored. In addition, the aforesaid biasing transistor 7 implements an appropriate capacitive decoupling between the respective sensing main bit-line MBLs, MBLs' and the input block 9a of the sense amplifier stage 9.

In a known manner, it is required for the value of the aforesaid cascode voltage $V_{casc}$ that is to be applied to the bit-lines during reading (or verifying) operations to be such as to maintain the memory cells 2 in the ON state during the entire reading (or verifying) operation. The biasing voltage has to ensure an ample safety margin, irrespective of the (SET or RESET) state of the aforesaid memory cells 2 and of the corresponding current. The cascode voltage $V_{casc}$ is such as to guarantee that the cells being read work in an optimal operating window in which a compromise between a reading speed and the capability of discrimination of the datum stored is satisfied.

A voltage generation unit 8 is configured to generate the aforesaid appropriate value of the cascode voltage $V_{casc}$ to be applied during the reading (or verifying) operation.

In known solutions, as illustrated schematically in FIG. 2, the aforesaid voltage generation unit 8 has a voltage-regulator architecture so as to generate the cascode voltage $V_{casc}$ having a value that depends only on a configuration current $I_{conf}$ of an appropriate value.

The voltage generation unit 8 comprises an operational amplifier 10, having a non-inverting terminal that receives a voltage reference $V_r$ of a pre-set value (for example, generated by a bandgap-voltage generator) and an output terminal that supplies the aforesaid cascode voltage $V_{casc}$.

The voltage generation unit 8 further comprises an NMOS transistor 11, having characteristics corresponding to the aforesaid biasing transistor 7, having its control terminal connected to the output terminal of the operational amplifier 10 that receives the aforesaid cascode voltage $V_{cas}$ and coupled between a supply line, which receives the supply voltage $V_{dd}$, and an internal node 12, on which a feedback voltage $V_{fb}$ is present.

This internal node 12 is coupled to the inverting terminal of the operational amplifier 10 so that, as a result of the unit feedback gain of the operational amplifier 10, the feedback voltage $V_{fb}$ is equal to the voltage reference $V_r$. In addition, a current generator 13 is coupled between the same internal node 12 and a reference terminal (for example, a ground terminal GND).

The current generator 13 generates the aforesaid configuration current $I_{conf}$, the value of which can be appropriately set so as to represent an intermediate value between the distribution of the current (circulating in the memory cells 2) associated to the SET state and that associated to the RESET state (in other words, the value of the configuration current $I_{conf}$ is intermediate between the lower-tail value of the distribution of the SET current and the upper-tail value of the distribution of the RESET current).

In this way, the voltage generation unit 8 operates so as to ensure the presence on the selected bit-line BL of a desired voltage value (basically corresponding to the aforesaid voltage reference $V_r$) for execution of the reading (or verifying) operations.

The present Applicant has realized that the aforesaid voltage generation unit 8 has, however, some limitations, in the case where, as it is represented in the aforesaid FIG. 1, the selector element 2b associated to the memory cell 2 is constituted by a BJT.

As shown in the aforesaid FIG. 1, the phase-change element 2a is in this case coupled between the emitter terminal of the BJT, which in the example is of a pnp type, of the respective selector element 2b and a respective local bit-line BL. In addition, the base terminal of the selector element 2b is electrically coupled to a respective wordline WL.

In particular, the base terminals of the selector elements 2b of memory cells 2 of a same row of the memory array are coupled to a same wordline WL, and the phase-change elements 2a of the memory cells 2 of a same column are coupled to a same local bit-line BL. The collector elements of the BJTs of the selector elements 2b are set at a reference voltage, for example at the ground reference voltage GND.

Use of selector elements 2b of a BJT type, to which the present disclosure makes specific reference, affords some advantages as compared to MOSFET technology, such as for example a reduction of the overall area occupied by the memory cells 2 and a resulting higher density of integration of the memory device.

However, the present Applicant has realized that the use of selector elements of a BJT type requires, as compared to the use of MOSFETs, an appropriate consideration, among other features, of the base currents of the respective BJTs, which flow along the wordlines WL (selected for the storage operations) and may thus cause undesired voltage drops along the same wordlines WL. These base currents are, in fact, rather high on account of the low gain factor (the so-called β factor) of the BJTs, being, for example, 70% of the emitter current, i.e., of the cell current $I_{cell}$.

FIG. 3 shows, in this regard, in a schematic manner, the resistances, denoted by $R_{WL}$, distributed along the metallization line associated to the wordline WL, which have a non-negligible value and entail, as a result of the aforesaid base current, here designated by $I_B$, even significant voltage drops on the same wordline WL.

FIG. 3 moreover shows a portion of a driver stage 15 coupled to the wordline WL, in particular a pull-down portion, in the example represented schematically by an NMOS pull-down transistor, configured to couple the wordline WL to a reference terminal (for example, the ground terminal GND), when the same wordline WL is selected for the reading or verifying operations (when it is not selected, the same wordline WL is, instead, biased at a positive voltage, of an appropriate value, by means of a so-called pull-up portion, here not illustrated, of the driver stage 15).

In a way not shown, the aforesaid pull-down portion may be generally constituted by a certain number of NMOS pull-down transistors (for example, four) connected in cascaded mode, each receiving a respective address signal and jointly configured to implement a NAND logic combination of the respective address signals for selection of the respective wordline WL.

The aforesaid base current $I_B$ hence determines a non-negligible voltage drop also on the driver stage 15, in particular across the aforesaid NMOS pull-down transistor (or transistors).

Moreover, in the same FIG. 3 the voltage drop between the base and emitter terminals of the BJT of the selector element 2a is designated by $V_{BE}$; this voltage drop represents a further element that has to be considered in order to obtain a desired value for the bit-line voltage.

Likewise, it is required to consider the voltage drop on the same phase-change element 2a of the memory cell 2 due to the current circulating along the bit-line BL.

Basically, the present Applicant has realized that, since voltage generation units of a known type, for example of the type described in FIG. 2, do not take into account the aforesaid factors linked to the specific nature of the selector elements 2b of a BJT type, they do not enable correct biasing of the bit-lines, thus possibly leading to a degradation in performance (for example, in terms of execution speed) or even causing errors in the reading or verifying operations.

The aim of the present invention is to provide a solution for generation of the bit-line voltage for a non-volatile memory device, in particular of the phase-change type, which will enable the drawbacks of the prior art to be overcome.

According to the present invention a bit-line voltage generation circuit and a corresponding method are provided, as defined in the annexed claims.

BRIEF DESCRIPTION OF THE DRAWINGS

For a better understanding of the present invention, preferred embodiments thereof are now described, purely by way of non-limiting example, with reference to the attached drawings, wherein.

DETAILED DESCRIPTION OF ILLUSTRATIVE EMBODIMENTS

Figure 4:
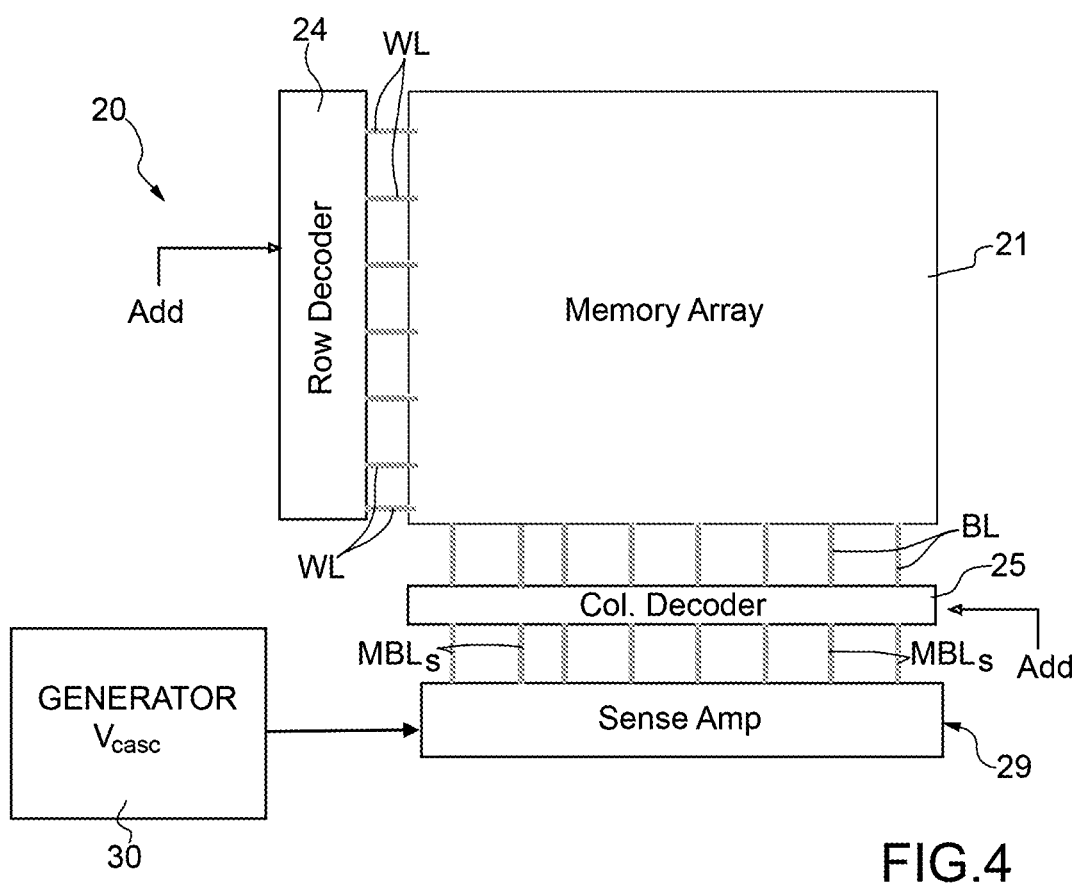
FIG. 4 is a schematic block diagram of a memory device according to one aspect of the present solution.

FIG. 4 is a schematic depiction of a non-volatile memory device, in particular of the phase-change type, designated as a whole by 20, comprising a memory array 21, the memory cells of which (here not illustrated) are coupled to respective wordlines WL (aligned in rows) and respective bit-lines (aligned in columns); in particular, the bit-lines are divided into main bit-lines and local bit-lines, in a way substantially similar to what has been illustrated previously with reference to FIG. 1.

The memory device 20 comprises, as illustrated schematically, a row decoder 24 and a column decoder 25, configured to appropriately address and bias, respectively, the wordlines WL and the local bit-lines BL, each time selected for the memory operations (in particular, reading and verifying operations), based on input addresses Add.

As discussed previously with reference to FIG. 1 (to which reference is made), the column decoder 25 comprises (for each local bit-line BL) a certain number of selection transistors 6 (not illustrated herein), for example PMOS transistors, which are cascaded between the respective (local) bit-line BL and a respective sensing main bit-line MBLs and receive, on a corresponding control terminal, a respective selection signal ($Y_o$, $Y_n$).

The memory device 20 further comprises the sense amplifier (SA) stage, here designated by 29, selectively coupled to the sensing main bit-lines MBLs associated to the memory cells 2, by way of the column decoder 25, and configured to compare the corresponding cell currents $I_{cell}$ in order to enable differential reading (or verifying) of the datum stored.

In a way here not illustrated (but described previously with respect to FIG. 1), the sense amplifier stage 29 comprises the biasing transistors 7, in particular NMOS transistors, connected between each sensing main bit-line MBLs and an input block 9a of the same sense amplifier stage 29.

Figure 1:
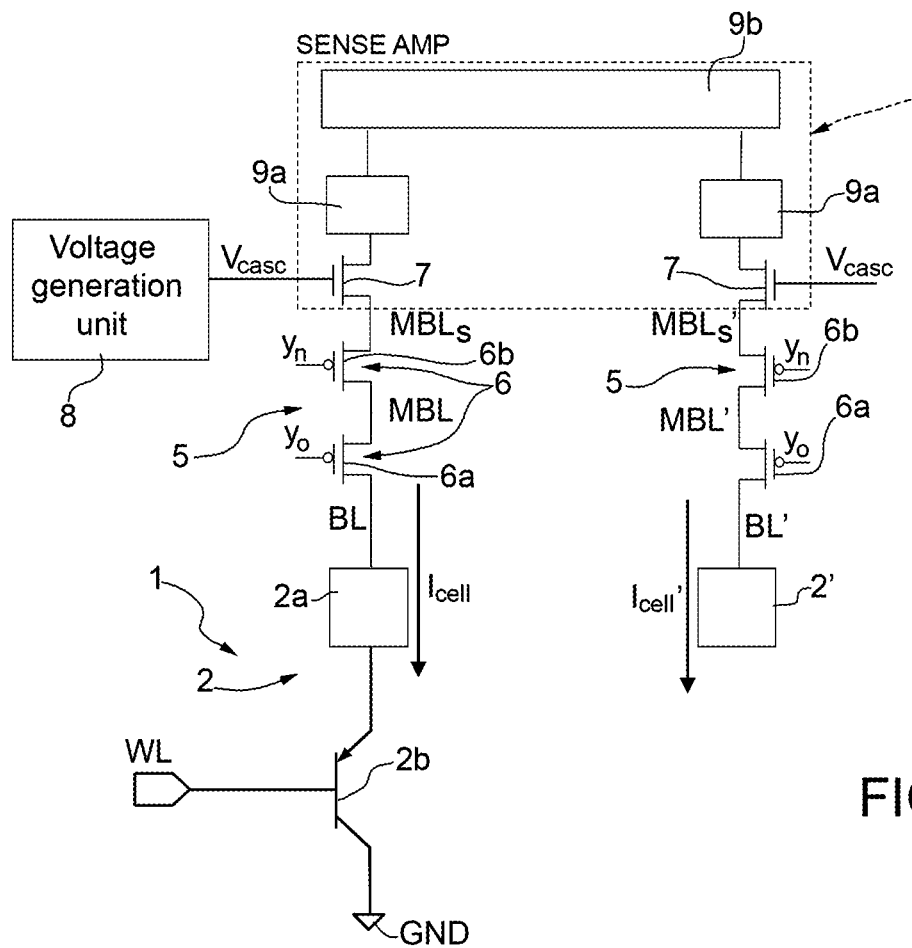
FIG. 1 is a schematic illustration of a portion of a non-volatile memory device, of a known type, during a differential reading operation.
Figure 2:
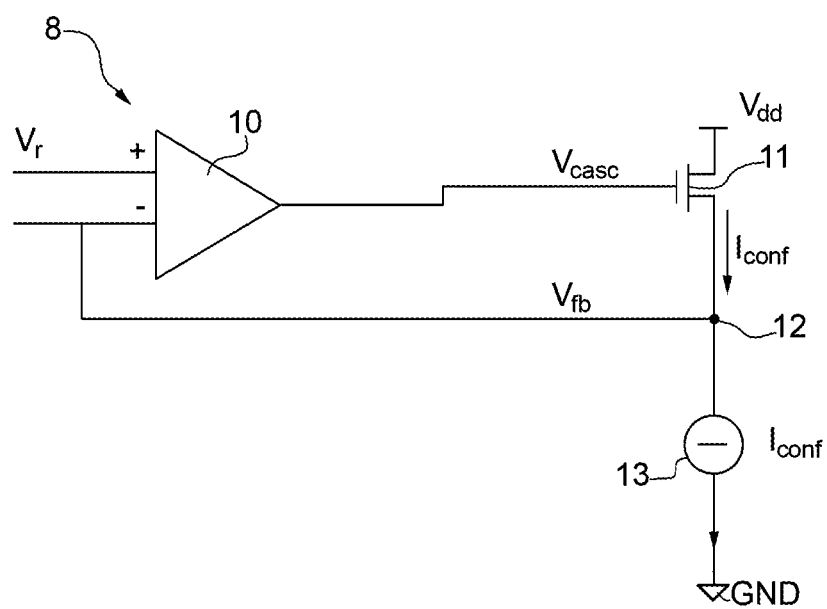
FIG. 2 shows the circuit diagram of a voltage generation unit in the memory device of FIG. 1.
Figure 3:
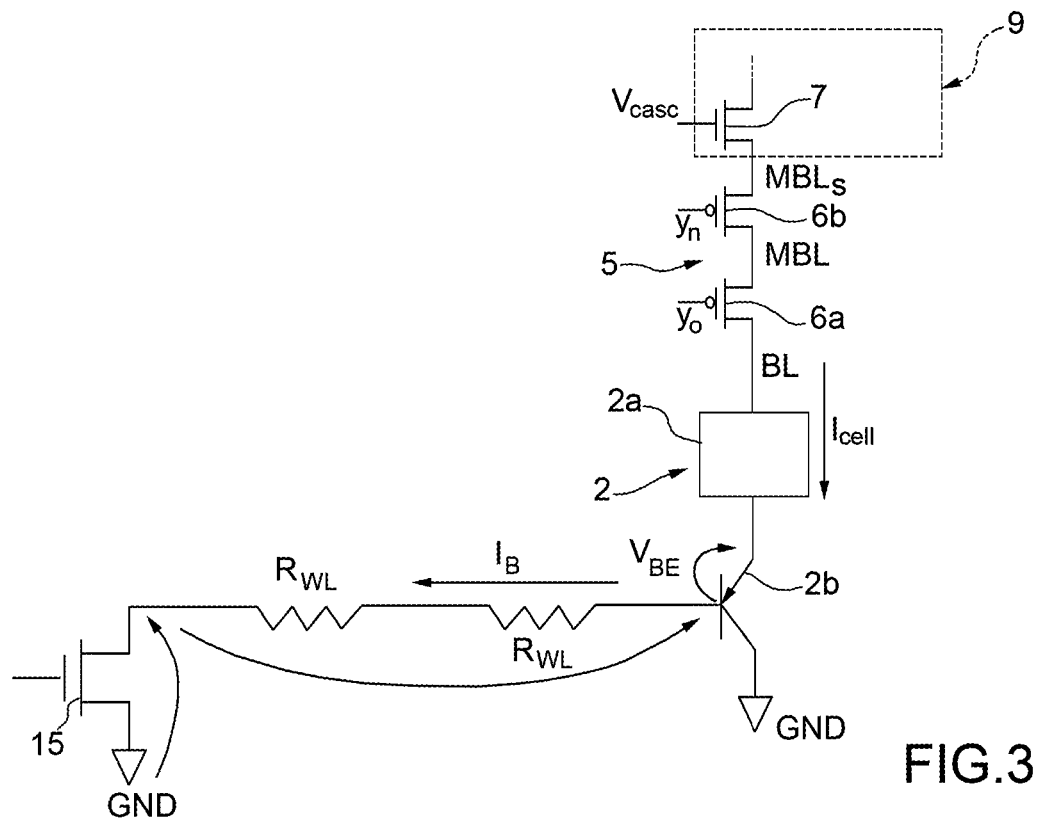
FIG. 3 is a schematic illustration of a memory cell and associated wordlines and bit-lines in the memory device of FIG. 1.

A voltage generation circuit 30 is operatively coupled to the sense amplifier stage 29 and is configured to generate an appropriate value for the cascode voltage $V_{casc}$ (in particular, for the control terminal of the aforesaid biasing transistors 7; see once again also the foregoing discussion and the aforesaid FIG. 1) in order to obtain a desired value for the voltage present on the bit-lines selected for the reading (or verifying) operations.

As will be described in detail hereinafter, according to an aspect of the present solution, the voltage generation circuit 30 is configured so as to generate the aforesaid cascode voltage $V_{casc}$, taking into account the factors linked to the nature of the selector elements 2b of a BJT type of the memory cells 2, thus enabling correct biasing of the bit-lines and preventing errors in the memory operations, in particular the reading (or verifying) operations.

In detail, and with reference now to FIG. 5, the voltage generation circuit 30 comprises a reference-generation stage 32, configured to generate a reference voltage $V_{ref}$, having an appropriate value (which, as will be described in detail, is a function of the aforesaid factors linked to the nature of the selector elements 2b of a BJT type), starting from a voltage reference $V_r$, which is generated by a voltage generator, for example of a band-gap type (here not illustrated), and hence has a stable and precise value irrespective of variations in the supply voltage and temperature and irrespective of process spread.

The voltage generation circuit 30 is provided with an output stage 34, comprising an operational amplifier 40, having a non-inverting terminal that receives the aforesaid reference voltage $V_{ref}$ from the reference-generation stage 32, an inverting terminal connected to a first internal node 41, on which a feedback voltage $V_{fb}$ is present, and an output terminal that supplies the cascode voltage $V_{casc}$ to be sent to the sense amplifier stage 29 of the memory device 20, in particular to the control terminal of a biasing transistor 7, of an NMOS type, connected to a respective sensing main bit-line MBLs.

The output stage 34 further comprises an output transistor 42, of an NMOS type, having characteristics corresponding to those of the biasing transistor 7, with its control terminal connected to the output terminal of the operational amplifier 40 that receives the aforesaid cascode voltage $V_{casc}$ and coupled between a supply line that receives the power-supply voltage $V_{dd}$ and a second internal node 43.

The second internal node 43 is coupled to the first internal node 41 through a first emulation block 45, configured to emulate the column decoder 25. This first emulation block 45 thus comprises a certain number of emulation transistors 46, in particular PMOS transistors, which are cascaded between the second internal node 43 and the first internal node 41 and in this case have their corresponding control terminal connected to the ground terminal GND (so as to always be in a conducting state).

Figure 5:
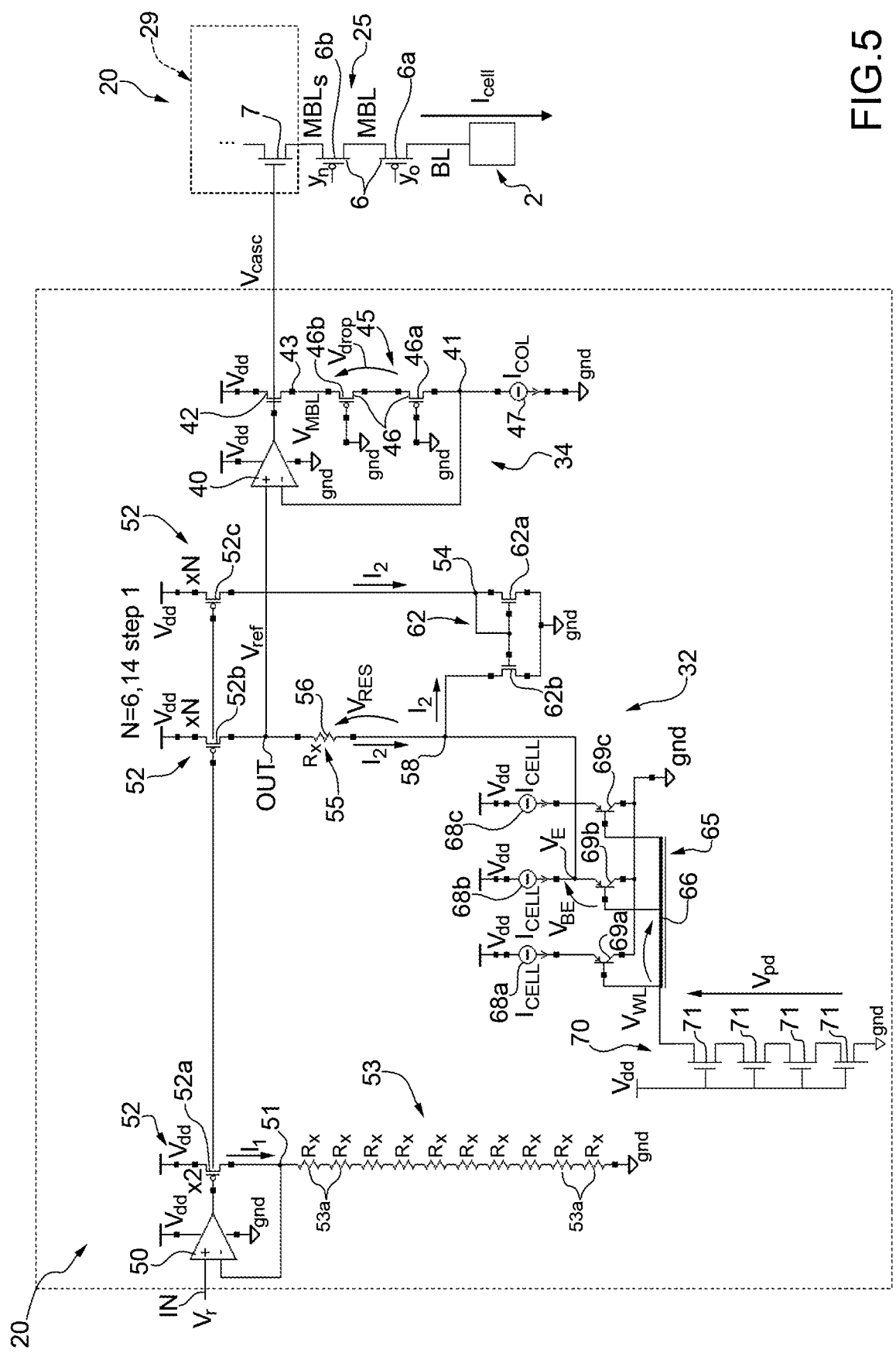
FIG. 5 shows the circuit diagram of a bit-line voltage generation circuit in the device of FIG. 4, according to the present solution.

Two emulation transistors 46a, 46b are illustrated by way of example in FIG. 5, which are connected in series between the aforesaid second internal node 43 and the aforesaid first internal node 41 (and are hence designed to emulate the selection transistors 6a, 6b that receive the first and second selection signals $Y_o$, $Y_n$ of the column decoder 25).

The output stage 34 further comprises a current generator 47, coupled between the aforesaid first internal node 41 and a reference terminal (in particular, the ground terminal GND). The current generator 47 is configured to generate a column current $I_{col}$, the value of which represents an intermediate value between the distribution of the current (circulating in the memory cells 2) associated to the SET state and that associated to the RESET state (in other words, the value of the column current $I_{col}$ is intermediate between the lower-tail value of the distribution of the SET current and the upper-tail value of the distribution of the RESET current and may, for example, be equal to 8 μA).

The first internal node 41, connected to the inverting terminal of the operational amplifier 40, thus has, as a result of the unit feedback gain of the operational amplifier 40, a voltage value equal to the reference voltage $V_{ref}$, while the second internal node 43 has a voltage $V_{MBL}$ equal to the sum of the aforesaid reference voltage $V_{ref}$ and a voltage drop $V_{drop}$ on the first emulation block 45 (and on the corresponding emulation transistors 46) as a result of the column current $I_{col}$: $V_{MBL} = V_{ref} + V_{drop}$.

As it is evident from an examination of the aforesaid FIG. 5, this voltage $V_{MBL}$ has a value corresponding to the desired voltage to set on the sensing main bit-line MBLs selected for the memory operations, in particular the reading (or verifying) operations, while the aforesaid reference voltage $V_{ref}$ corresponds to the voltage on the corresponding local bit-line BL.

In greater detail, the reference-generation stage 32 has an input IN designed to receive the voltage reference $V_r$, generated by the voltage generator, for example of a bandgap type, and an output OUT designed to supply the reference voltage $V_{ref}$.

The reference-generation stage 32 comprises an input operational amplifier 50, having a non-inverting terminal that is connected to the aforesaid input IN and receives the voltage reference $V_r$, a non-inverting terminal connected to a third internal node 51, and an output terminal connected to a first current mirror 52.

A resistive block 53 is connected between the third internal node 51 and the ground terminal GND. In particular, the resistive block 53 is constituted by the series of a certain number of resistors 53a (in the example illustrated, ten) having a same resistance value $R_x$, for example 20 kΩ. A first current $I_1$ flows in the resistive block 53 (i.e., in the aforesaid series of resistors) and in the example has a value $I_1 = V_r / (10 \cdot R_x)$.

The first current mirror 52 comprises: a first mirror transistor 52a (of a PMOS type), which is connected between the third internal node 51 and the line set at the supply voltage $V_{dd}$ and has its control terminal connected to the output terminal of the input operational amplifier 50; a second mirror transistor 52b (also of a PMOS type), which is coupled, with a mirror ratio N/2 (where N has a value that can be configured, for example, between 6 and 14 in unit steps), to the first mirror transistor sea, is connected between the output OUT and the line set at the supply voltage $V_{dd}$, and has its control terminal connected to the same output terminal of the input operational amplifier 50; and a third mirror transistor 52c (also of a PMOS type), which is coupled, with the same mirror ratio N/2, to the first mirror transistor sea, is connected between a fourth internal node 54 and the terminal set at the supply voltage $V_{dd}$, and has its control terminal connected to the same output terminal of the input operational amplifier 50.

By virtue of the current mirroring by the first current mirror 52, the second and third mirror transistors 52b, 52c supply on the output OUT and on the fourth internal node 54, respectively, a second current $I_2$, mirrored with respect to the first current $I_1$ and having a value equal to $I_1 \cdot N/2$.

The reference-generation stage 32 further comprises a second emulation block 55, configured to emulate the phase-change element 2a of the memory cell 2. This second emulation block 55 is provided by an emulation resistor 56, which is made so as to be matched with the resistors 53a of the resistive block 53 and has, in particular, the same value of resistance $R_x$ (in a way that will be evident, this emulation resistor 56 may be physically made at the resistive block 53 and with the same manufacturing techniques so as to achieve a minimal spread between the respective resistance values).

In particular, the aforesaid emulation resistor 56 is connected between the output OUT and a fifth internal node 58, and is traversed by the second current $I_2$ so as to determine a voltage drop $V_{RES}$ equal to $R_x \cdot I_1 \cdot N/2$.

The reference-generation stage 32 further comprises a second current mirror 62, with a unit mirror ratio, coupled to the aforesaid fifth internal node 58 and to the aforesaid fourth internal node 54 and comprising: a respective first mirror transistor 62a (of an NMOS type), in diode configuration, connected between the fourth internal node 54 and the ground terminal GND; and a respective second mirror transistor 62b (also of an NMOS type), which is connected between the fifth internal node 58 and the ground terminal GND and has its control terminal connected to the control terminal of the respective first mirror transistor 62a.

In particular, as a result of current mirroring by the second current mirror 62, the respective second mirror transistor 62b extracts from the fifth internal node 58 the entire second current $I_2$ that flows through the second emulation block 55 (i.e., through the emulation resistor 56).

The reference-generation stage 32 further comprises a third emulation block 65, coupled to the aforesaid fifth internal node 58.

The third emulation block 65 is configured to emulate a wordline WL of the memory array 21 and the corresponding memory cells 2 associated thereto, in particular as regards the voltage drop due to the current circulating (as discussed previously) as a result of the base current $I_B$ of the selector element 2b, of a BJT type, associated to the same memory cell 2.

The third emulation block 65 comprises: a metallization line 66, referred to as "dummy", configured to emulate the resistive contribution of the wordlines WL; and a first, a second, and a third cell-current generator 68a, 68b, 68c which are configured to emulate the injection of a cell current $I_{cell}$ by a respective memory cell and are coupled to the metallization line 66 at an initial end, at a central intermediate point, and at a final end, respectively.

In particular, the cell current $I_{cell}$ has a value that represents the current of a memory cell that is in the SET state (programmed state) and is hence higher than the aforesaid column current $I_{col}$, being, for example, equal to 22 μA.

The third emulation block 65 further comprises a first selector transistor 69a, a second selector transistor 69b, and a third selector transistor 69c, in particular, bipolar transistors, which are configured to emulate the selector elements 2b of the memory cells 2, are connected between the first, second, and third cell-current generator 68a, 68b, 68c, respectively, and the ground terminal GND, and have their base terminal connected to the initial end, to the central intermediate point, and to the final end, respectively, of the metallization line 66.

In particular, the emitter of the second selector transistor 69b (having its base terminal connected to the central intermediate point of the metallization line 66) is connected to the aforesaid fifth internal node 58.

It is to be noted that on a real wordline WL of the memory array 21 a larger number of memory cells 2 is present (which are associated to the selected local bit-lines BL), for example thirty-seven in number, whereas only three cell-current generators 68a, 68b, 68c (which each emulate the cell current $I_{cell}$ of a single memory cell 2) are coupled to the metallization line 66.

For this reason, the metallization line 66 is chosen of an appropriate length so as to have a resistance such as to cause a voltage drop that will appropriately emulate the real voltage drop on the wordline WL, and in particular represents the mean value of the wordline voltage distribution during the reading (or verifying) operations.

Advantageously (also in order to reduce the occupation of area), the metallization line 66 has an overall length that is approximately half the length of the wordline WL and is moreover folded a number of times in serpentine fashion.

It is also noted that the point of acquisition of the voltage drop, i.e., at the emitter of the second selector transistor 69b connected to the central intermediate point of the metallization line 66, effectively enables acquisition of a voltage drop of an average value from among the ones available on the same metallization line 66.

The reference-generation stage 32 further comprises a fourth emulation block 70, coupled to the aforesaid initial end of the metallization line 66.

The fourth emulation block 70 is configured to emulate the pull-down portion of the driver stage 15 coupled to the wordline WL, in particular as regards the voltage drop due to the current circulating in the same wordline WL (as discussed previously).

The fourth emulation block 70, as illustrated schematically once again in FIG. 5, hence comprises a certain number of pull-down transistors 71 (in the example represented, four), of an NMOS type, which are connected in series between the aforesaid initial end of the metallization line 66 and the ground terminal GND and have respective control terminals coupled to the line set at the supply voltage $V_{dd}$, so that the NMOS pull-down transistors 71 will always be in the ON (active or conductive) state.

In particular, the fourth emulation block 70 is provided so as to determine a voltage drop that will appropriately emulate the real drop on the pull-down portion of the driver stage 15.

For this reason, in order to take into account the lower current on the metallization line 66 as compared to that of the wordline WL of the memory array 21, the NMOS pull-down transistors 71 are made so as to have a higher resistivity than the corresponding pull-down transistors of the driver stage 15, for example a resistivity that is four times higher.

For this purpose, the NMOS pull-down transistors 71 may be provided with a smaller channel width W, for example equal to one quarter, as compared to the corresponding channel width of the pull-down transistors of the driver stage 15 (advantageously also obtaining a reduction in dimensions for the fourth emulation block 70).

Based on what has been described previously, it will be evident that the reference voltage $V_{ref}$ on the output OUT of the reference-generation stage 32 may be expressed as the sum of the following contributions: the voltage drop on the fourth emulation block 70 (i.e., on the cascade of the NMOS pull-down transistors 71), designated by $V_{pd}$; the voltage drop on the metallization line 66, designated by $V_{WL}$; the voltage drop between the base and the emitter of the second selector transistor 69b, designated by $V_{BE}$; and the voltage drop on the second emulation block 55 (i.e., on the emulation resistor 56), designated, as pointed out previously, by $V_{RES}$.

The reference voltage $V_{ref}$ can hence be expressed as:
$V_{ref} = V_{pd} + V_{WL} + V_{BE} + V_{RES}$.

In particular, the sum of the aforesaid contributions ($V_{pd} + V_{WL} + V_{BE}$) represents the voltage on the emitter of the second selector transistor 69b, designated by $V_E$, which hence depends only on the cell current $I_{cell}$, whereas the contribution $V_{RES}$ depends only on the second current $I_2$ that flows through the emulation resistor 56, this contribution $V_{RES}$ being equal to $(V_r/10) \cdot N/2$ as a result, as discussed previously, of the current-mirroring operation carried out by the first and second current mirrors 52, 62 (it is to be noted that this voltage does not depend on the resistance value $R_x$).

In other words, the aforesaid reference voltage $V_{ref}$ is the sum of two macro-contributions, the first being the aforesaid emitter voltage $V_E$ and the second being the aforesaid voltage $V_{RES}$ on the emulation resistor 56, which are altogether independent of one another and do not have any effect on each other, it thus being possible to control them separately and individually for generation of the aforesaid reference voltage $V_{ref}$ (in particular, as a function of the cell current $I_{cell}$ for the first contribution, and of the second current $I_2$, i.e., of the voltage reference $V_r$ and of the mirroring factor N/2, for the second contribution).

As mentioned previously, to the aforesaid contributions defining the reference voltage $V_{ref}$, a further contribution is to be added (externally to the reference-generation stage 32) for definition of the bit-line voltage as a result of the cascode voltage $V_{casc}$, i.e. the aforesaid voltage drop $V_{drop}$ on the emulation transistors 46 of the first emulation block 45.

It is to be noted that also this further contribution (represented by the voltage drop $V_{drop}$), which depends only on the column current $I_{col}$, is altogether independent of, and not affected by, the other contributions (the aforesaid emitter voltage $V_E$ and the aforesaid voltage $V_{RES}$ on the emulation resistor 56), thus being possible to control it separately and individually (in particular, via definition of the column current $I_{col}$).

The advantages of the present solution emerge clearly from the foregoing description.

In any case, it is once again underlined that the voltage generation circuit 30 generates the cascode voltage $V_{casc}$ for definition of the bit-line voltage during the memory operations, in particular the reading (or verifying) operations, taking into account all the significant factors linked to the nature of the BJT selector elements 2b of the memory cells 2, in particular linked to the corresponding base currents $I_B$, thus enabling correct biasing of the bit-lines and preventing any degradation of performance or errors in the memory operations, in particular in the reading (or verifying) operations.

The aforesaid voltage generation circuit 30 in particular allows to consider the voltage drop on the driver stage 15 of the wordline WL, the voltage drop on the same wordline WL, the voltage drop on the selector element 2b of the memory cell 2, and moreover the voltage drop on the phase-change element 2a of the same memory cell 2.

Advantageously, the contributions that determine the bit-line voltage can be controlled and configured individually and separately (since they do not have any effect on each other).

Figure 6:
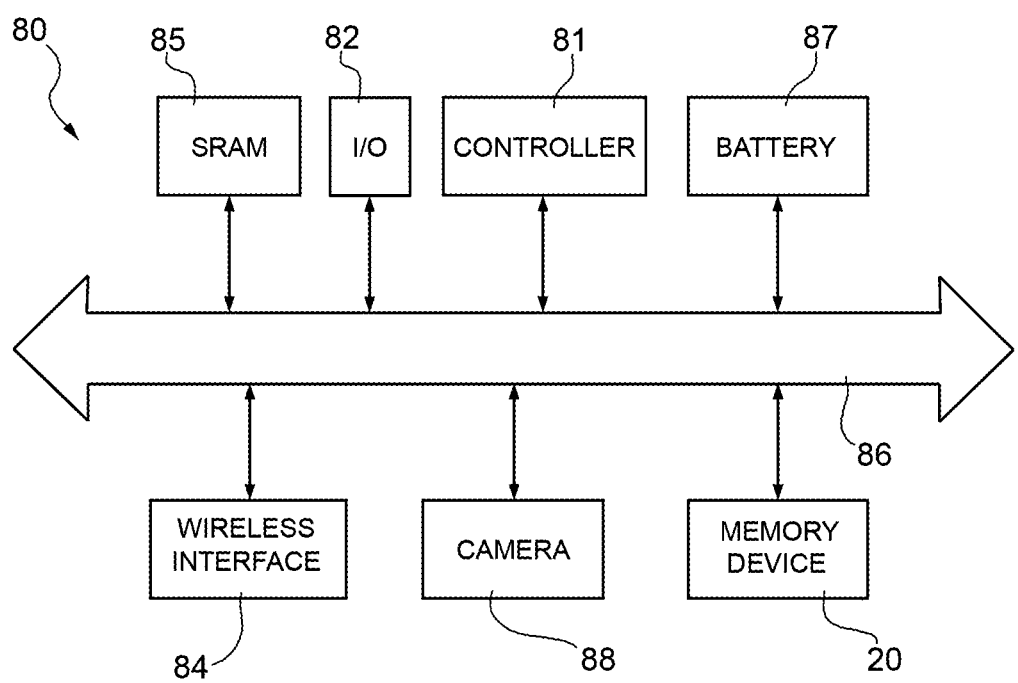
FIG. 6 is a simplified block diagram of an electronic system incorporating the memory device of FIG. 4.

The aforesaid characteristics hence render particularly advantageous use of the memory device 1 in an electronic system 80, for example as illustrated schematically in FIG. 6.

The electronic system 80 may be used in electronic devices, such as: a PDA (Personal Digital Assistant); a portable or fixed computer, possibly with wireless data-transfer capability; a mobile phone; a digital audio player; a photographic or video camera; or further portable devices capable of processing, storing, transmitting, and receiving information.

The electronic system 80 comprises the memory device 20, provided with the memory array 21 (not illustrated herein) of memory cells 2 of the phase-change type, described previously, and a controller 81 (for example, provided with a microprocessor, a DSP, or a microcontroller), both coupled to a bus 86 designed to route signals (for example, for address selection) towards the memory device 20.

Furthermore, the electronic system 80 may optionally comprise, coupled to the bus 86, one or more of the following: an input/output device 82 (for example, provided with a keypad and a display), for input and display of data; a wireless interface 84, for example an antenna, for transmitting and receiving data through a radio-frequency wireless communication network; a RAM 85; a battery 87, which can be used as electric-power supply source in the electronic system 80; and a photographic and/or video camera 88.

According to a different embodiment, the controller 81 may be coupled to the memory device 20 by means of a dedicated connection different from, and possibly additional to, the bus 86 (the latter may be present or absent).

Finally, it is clear that modifications and variations may be made to what has been described and illustrated herein, without thereby departing from the scope of the present invention, as defined in the annexed claims.

In particular, it is underlined that, even though what has been described advantageously applies to non-volatile memory devices of a PCM type, the same solution may be applied to further and different non-volatile memory devices, in which the state of the memory cells is associated to a current circulating therein.

Furthermore, the phase-change element of the memory cells may in general be replaced by a generic variable-resistance element, provided via any available technology (even not of the phase-change type).

What is claimed is:

1. A voltage generation circuit for a non-volatile memory device comprising a memory array having a plurality of memory cells coupled to respective wordlines and local bit-lines, each memory cell comprising a storage element and a selector element including a bipolar transistor coupled to the storage element and configured to selectively enable flow of a cell current during reading or verifying operations, wherein a base terminal of the selector element is coupled to a respective wordline, wherein a sense amplifier stage is associated with the local bit-lines via a column decoder, wherein the sense amplifier stage comprises at its input respective biasing transistors each having a control terminal, and wherein a driver stage is coupled to each wordline for biasing thereof during the reading or verifying operations, wherein the voltage generation circuit is configured to: generate a cascode voltage for the control terminals of the biasing transistors based on a reference voltage, wherein the reference voltage is a function of an emulation of a respective voltage drop on the driver stage, on the wordline, and on the memory cell, as a result of a current associated with the corresponding selector element.

2. The circuit according to claim 1, comprising:
a reference-generation stage configured to generate, on an output, the reference voltage starting from a voltage reference received at input; and
an output stage, configured to generate the cascode voltage based on the reference voltage;
wherein the output stage comprises:
an operational amplifier having a non-inverting terminal that receives the reference voltage from the reference-generation stage, an inverting terminal connected to a first internal node, and an output terminal that supplies the cascode voltage;
an output transistor having its control terminal connected to the output terminal of the operational amplifier receiving the cascode voltage and coupled between a supply line and the first internal node; and
a current generator coupled to the first internal node and configured to generate a column current having a value representing an intermediate value of a current circulating in the memory cells.

3. The circuit according to claim 2, wherein the reference-generation stage comprises:
a first emulation block coupling the output transistor to the first internal node, and configured to emulate the column decoder with respect to a first voltage drop due to the column current.

4. The circuit according to claim 3, wherein the first emulation block comprises a number of PMOS-type emulation transistors that are cascaded between the output transistor and the first internal node, and have a corresponding control terminal connected to a ground terminal to be in a conducting state.

5. The circuit according to claim 3, wherein the reference-generation stage comprises:
a second emulation block, configured to emulate a phase-change element of a memory cell with respect to a corresponding second voltage drop;
a third emulation block, configured to emulate the wordline of the memory array and memory cells associated therewith with respect to a corresponding third voltage drop; and
a fourth emulation block, configured to emulate the driver stage, with respect to a corresponding fourth voltage drop;
wherein the reference-generation stage is configured so that a contribution, for creation of the reference voltage, of the second voltage drop is controllable separately and individually with respect to contributions of the third voltage drop and fourth voltage drop.

6. The circuit according to claim 5, wherein the second emulation block comprises an emulation resistor, which is coupled between the output and an internal node, connected to the third emulation block, and is designed to receive a mirrored current from a first current mirror; the first current mirror having a mirror branch, which generates a mirror current based on the voltage reference, a first mirrored branch, which is connected to the output and to the emulation resistor and supplying the mirrored current based on a mirror ratio with respect to the mirror current, and a second mirrored branch, which is connected to a further internal node; and wherein the reference-generation stage further comprises a second current mirror having a unit mirror ratio, coupled between the internal node and the further internal node and configured to extract from the internal node a current equal to the mirrored current flowing through the emulation resistor.

7. The circuit according to claim 6, wherein the reference-generation stage further comprises:
a resistive block, formed by a number of resistors having a same resistance and on which the voltage reference is present;
wherein the mirror current is the current circulating in the resistive block, and wherein the emulation resistor is matched to the resistors, having substantially the same resistance.

8. The circuit according to claim 5, wherein the third emulation block comprises:
a metallization line, configured to emulate the wordline, with respect to a relative voltage drop;
a first, a second and a third cell-current generator configured to emulate injection of a cell current on the metallization line and coupled to the metallization line at an initial end, a central intermediate point, and a final end, respectively; and
a first selector transistor, a second selector transistor, and a third selector transistor, of a bipolar type, which are configured to emulate selector elements of respective memory cells, are connected between the first, second, and third cell-current generator, respectively, and a ground terminal and have their base terminals connected to the initial end, to the central intermediate point, and to the final end, respectively, of the metallization line, wherein an emitter terminal of the second selector transistor is connected to the second emulation block.

9. The circuit according to claim 8, wherein the cell current has a value representing the current of a memory cell in a programmed state and is greater than the column current.

10. The circuit according to claim 8, wherein the metallization line has an overall length that is approximately half a length of the wordline and is folded a number of times in a serpentine fashion.

11. The circuit according to claim 8, wherein the fourth emulation block comprises a number of NMOS-type pull-down transistors that are connected in series between the initial end of the metallization line and a ground terminal, and have respective control terminals coupled to the supply line to be in a conducting state.

12. The circuit according to claim 8, wherein the reference voltage is given by a sum of the second voltage drop on the second emulation block, of the third voltage drop on the third emulation block, and of the fourth voltage drop on the fourth emulation block; and the third voltage drop being given by a sum of a voltage drop on the metallization line and of a voltage drop between the base terminal and the emitter terminal of the second selector transistor.

13. The circuit according to claim 1, wherein the memory cells are phase-change memory cells.

14. An electronic apparatus comprising:
a non-volatile memory device comprising:
a memory array having a plurality of memory cells coupled to respective wordlines and local bit-lines, each memory cell comprising a storage element and a selector element, each selector element comprising a bipolar transistor coupled to the storage element and configured to selectively enable flow of a cell current during reading or verifying operations, wherein a base terminal of the selector element is coupled to a respective wordline, wherein a biasing transistor has a control terminal associated with each local bit-line, via a column decoder, and wherein a driver stage is coupled to one end of each wordline for biasing thereof during the reading or verification operations; and
a voltage generation circuit configured to generate a cascode voltage for control terminals of the biasing transistors based on a reference voltage, wherein the reference voltage is a function of an emulation of a respective voltage drop on the driver stage, on the wordline, and on the memory cell, as a result of a current associated with the corresponding selector element.

15. The electronic apparatus according to claim 14, further comprising:
a controller coupled to the non-volatile memory device.

16. The electronic apparatus according to claim 14, wherein the memory cells are phase-change memory cells.

17. A voltage generation method, for a non-volatile memory device comprising a memory array having a plurality of memory cells coupled to respective wordlines and local bit-lines, each memory cell comprising a storage element and a selector element including a bipolar transistor coupled to the storage element and configured to selectively enable flow of a cell current during reading or verifying operations, a base terminal of the selector element being coupled to a respective wordline, a biasing transistor having a control terminal being associated with each local bit-line, via a column decoder, and a driver stage being coupled to one end of each wordline for biasing thereof during the reading or verification operations, the method comprising:
generating a cascode voltage for the control terminal based on a reference voltage, the reference voltage being a function of an emulation of a voltage drop on the driver stage, on the wordline, and on the memory cell, as a result of a current associated with the corresponding selector element.

18. The method according to claim 17, wherein generating the cascode voltage comprises controlling separately and individually a contribution for the generation of the reference voltage of a voltage drop on an emulation block, the emulation block configured to emulate a phase-change element of the memory cell, with respect to contributions of further emulation blocks, the further emulation blocks configured to emulate the wordline of the memory array and memory cells associated therewith, and, respectively, the driver stage.

19. The method according to claim 18, wherein generating the cascode voltage further comprises emulating the column decoder with respect to a corresponding voltage drop due to a column current having a value representing an intermediate value of a current circulating in the memory cells.

20. The method according to claim 17, wherein the memory cells are phase-change memory cells.

* * * * *